United States Patent [19]
DeJong

[11] Patent Number: 5,359,226
[45] Date of Patent: Oct. 25, 1994

[54] STATIC MEMORY WITH SELF ALIGNED CONTACTS AND SPLIT WORD LINES

[75] Inventor: Jan L. DeJong, San Jose, Calif.

[73] Assignee: Paradigm Technology, Inc., San Jose, Calif.

[21] Appl. No.: 12,191

[22] Filed: Feb. 2, 1993

[51] Int. Cl.$^5$ .................... H01L 23/48; H01L 27/02; G11C 11/34

[52] U.S. Cl. .................... 257/773; 257/776; 257/903; 257/393; 257/401; 365/182

[58] Field of Search ............. 257/773, 776, 903, 393, 257/401, 66; 365/182

[56] References Cited

PUBLICATIONS

Itabashi, et al., *IEDM Tech. Dig.*, pp. 477–480, 1991.
Ohkubo, H., et al., *IEDM Tech. Dig.*, pp. 481–484, 1991.
Matsumiya, et al., *IEEE Journal of Sol. St. Cir.*, vol. 27, No. 11, Nov., 1992.
Sasaki, et al., *IEEE Journal of Sol. St. Circ.*, vol. 27, No. 11, Nov., 1992.

*Primary Examiner*—Mark V. Prenty
*Attorney, Agent, or Firm*—Skjerven, Morrill, MacPherson, Franklin & Friel

[57] ABSTRACT

A compact static random access memory is formed using both split word lines and self aligned contacts. Self aligned contacts between gates of the pull-down transistor and cross-couple interconnects decreases the critical spacing between elements of the cell and permit the cell to be smaller or more manufacturable. The use of split word lines allows memory cell connections to the bit lines to be located on opposite sides of a memory cell. The connections are widely separated along a direction parallel to the bit lines so perpendicular separation between the bit lines can be decreased. The split word lines also allow the memory cell lay out to be symmetric and thereby increases stability. Use of self aligned contacts further decreases the necessary separation between the bit lines. A further feature is a straight conductor which runs though the center of the memory cell and connects the source of the pull-down transistors to a reference voltage $V_{SS}$.

11 Claims, 7 Drawing Sheets

STATIC MEMORY WITH SELF ALIGNED CONTACTS AND SPLIT WORD LINES

BACKGROUND OF THE INVENTION

1. Field of the Invention

This invention relates to compact static random access memories that use self aligned contacts and split word lines.

2. Description of Related Art

Application Ser. No. 07/555,559, filed Jul. 19, 1990, entitled "Compact SRAM Cell Layout", now U.S. Pat. No. 5,124,774, which is a continuation-in-part of Ser. No. 07/464,496 filed on Jan. 12, 1990, entitled "Self-aligning Contact and Interconnect Structure", now U.S. Pat. No. 5,166,771 have the same assignee as the present application, and cover formation of self aligned contacts. This application incorporates by reference the above-mentioned applications Ser. No. 07/555,559 and 07/464,496. This application is related to and also incorporates by reference: application Ser. No. 07/464,094, filed Jan. 12, 1990 and entitled "High Resistance Polysilicon Load Resistor", now U.S. Pat. No. 5,172,211; application Ser. No. 7/724,008, filed Jul. 1, 1991, entitled "Method of Fabricating a High Resistance Polysilicon Load Resistor", now U.S. Pat. No. 5,168,076; and Ser. No. 07/984,666, filed Dec. 2, 1992, entitled "Transistor Fabrication Methods and Methods of Forming Multiple Layers of Photoresist", all of which have the same assignee as the present application.

A static random access memory (SRAM) typically includes an array of memory cells. In one such cell as shown in FIG. 1, the cell has two possible states indicated by the voltage levels at two nodes 103, 104. Typically, a static memory cell includes two pull-down transistors 101, 102 having their sources connected to a reference potential $V_{SS}$ and their gates and drains cross coupled such that the drains 103, 104 of the pull-down transistors 101, 102 are connected to the gates of transistors 102, 101, respectively. Each of the nodes 103, 104 is also connected to a pull-up device 105, 106. Each pull-up device 105, 106 may take the form of a load resistor or a pull-up transistor which connects between an operating potential $V_{CC}$ and the corresponding node 103, 104.

Pass transistors 107, 108 connect the nodes 103, 104 to bit lines BL, $\overline{BL}$. The same bit lines, BL and $\overline{BL}$, connect to a number of memory cells that are arranged in a column. The gates of the pass transistors 107, 108 are typically connected to a word line WL, and the same word line WL connects to a number of memory cells that are arranged in a row.

A memory includes an array of memory cells, each cell as described above, with a grid formed from a set of parallel word lines that crosses a set of parallel bit lines. From this array, a desired cell is accessed by asserting a voltage to the word line connected to the desired cell. This causes all the pass transistors connected to this word line WL to conduct. The voltage levels of the bit lines BL, $\overline{BL}$ connected though the conducting pass transistors to nodes 103, 104 of the desired memory cell, change according to whether the pull-down transistor 101 or 102 is conducting. The state of the desired memory cell can then be read by sensing the voltage difference that develops between the bit lines BL, $\overline{BL}$ or the desired cell may be written to by asserting voltages to the bit lines BL, $\overline{BL}$ which connect to the desired cell.

Two goals of memory fabrication are to reduce memory size and increase manufacturing yield. Size reduction permits more memory cells to be placed on a chip, and generally lowers manufacturing cost by reducing the amount of silicon "real estate" required to make a memory. Higher manufacturing yield directly reduces per unit cost by providing more usable product for a fixed fabrication cost. Many techniques have been developed to achieve these goals.

One technique is efficient layout of memory cell elements. Generally, the layout of the elements in a memory cell is restricted by the manufacturing requirements. For example, contacts between various layers in an integrated circuit memory cell must be aligned, and separation must be provided between elements that require isolation.

During manufacturing, alignment of consecutive layers of an integrated circuit is imperfect, so tolerances must be incorporated into a memory cell layout. Also, elements on layers of an integrated circuit must have minimum separations to permit etching without stringers of conductive material being left between regions that should be isolated. These manufacturing concerns require the separation between elements and the size of contacts be sufficient to produce a working circuit even with expected misalignments and etching limitations.

With the manufacturing requirements in mind an efficient layout makes the memory cell as compact as possible. A problem with prior art memory cells is irregularly shaped elements that must be isolated from other elements in the cell. Active regions with protruding connections have larger perimeters for the same current carrying capacity when compared to regions without protrusions. The size of the surrounding isolation region depends on the length of the perimeter and hence also tends to be larger. An efficient layout positions and shapes the elements of a memory cell so that isolation regions are minimized while the critical separations remain sufficient.

FIG. 2 shows the layout of two layers of a typical SRAM cell. Two types of region are shown, active regions in a silicon substrate and regions formed from a first polysilicon layer. Active regions 201, 202 are used to form pull-down transistors. As part of a first doped polycrystalline silicon layer (poly-1) a region 211 forms a gate 211a for a pull-down transistor formed from the region 201. Region 211b is an interconnect that connects the gate 211a to the node 204a, and region 211c is an interconnect between the gate 211a and the drain 202a of the pull-down transistor formed from the active region 202. Poly-1 region 212 forms a gate 212a for a pull-down transistor formed from the region 202 and connects the gate 212a to node 201a and the drain 201c of pull-down transistor formed in region 201. Poly-1 region 213 forms the word line WL and gates 213a and 213b for pass-transistors formed from the active regions 201 and 204.

Contacts 211b, 211e, and 212b in poly-1 regions 211, and 212 connect from the poly-1 layer to the active region beneath. Contacts 201b, 204b in active regions 201, 204 are for connection to bit lines which are formed on a layer not shown. The contact areas 211d, 211e, 212b, 201b, 204b must be relatively large to compensate for expected manufacturing misalignment.

One technique for reducing the required minimum separations and minimum contact size is to use self aligned contacts. Examples of the structure of a self aligned contact and then techniques for forming a self aligned contact are described in "Self-aligning Contact and Interconnect Structure", U.S. Pat. No. 5,166,771 and "Compact SRAM Cell Layout", U.S. Pat. No. 5,124,774 which were incorporated by reference.

Another concern which can be addressed by efficient memory cell layout is stability of the cell. Generally, the layout of a memory cell, such as the cell shown in FIG. 2, is not physically symmetric. Asymmetry in the layout of cell elements causes asymmetry in performance of individual elements and in performance of the cell as a whole. For example, pull-down transistors formed from regions 201 and 202 may have different characteristics caused by differences in the shape of the active regions 201 and 202. Lack of symmetry causes the memory cell to have a preferred state where a particular node 201a or 204a is at the higher voltage. During a read of a memory cell or other operation, the memory cell can erroneously switch (be unstable) from its correct state to the preferred state. Asymmetric cells therefore have a greater chance of error.

Perfectly symmetric (stable) cells do not have a preferred state because there is no physical basis for distinguishing one node from another. In actual memory cells perfect symmetry cannot be achieved, but greater symmetry improves stability and a symmetric cell layout is desirable.

The typical memory cell described above has a single word line WL which connects to (or actually forms) both gates of the pass transistor. For a straight word line this requires that the gates of the pass transistors be in a line. Straight or nearly straight word lines, as shown in FIG. 2, are convenient for memories with cells arranged in a square or rectangular array and are commonly employed.

Instead of a single word line, some memory cell layouts employ a split word line. For these memory cells, the split word line includes a first and a second word line. The first word line connects to (or forms) the gate of the first pass transistor, the second word line connects to (or forms) the gate of the second pass transistor. The two word lines can be electrically coupled together outside the cell so that the split word line acts as a single line which activates both pass transistors simultaneously. With a split word line the layout of a memory cell no longer requires that the pass transistors (corresponding to pass transistors 107 and 108 in FIG. 1) be in a line or nearly in a line. Instead for example the pass transistors can be located on opposite sides of the cell.

FIG. 3 shows a layout of a prior art memory cell with split word lines WL1, WL2. Active regions 301 and 302 form the pull-down transistors and pass transistors. The split word lines WL1, WL2 form the gates 313a, 314a of the pass transistors. Poly-1 regions 311, 312 form gates 311a, 312a of the pull-down transistors and serve as interconnects to cross-couple the gates 311a, 312a and drains of the pull-down transistors. As seen in FIG. 3, the pass transistors and the contacts 301a, 302a to the bit lines are formed on opposite sides of the memory cell, and the overall layout of the cell is symmetric.

SUMMARY OF THE INVENTION

In accordance with the present invention, a memory cell is provided with an efficient layout of circuit elements that uses both a split word line and self aligned contacts. The combination of split word lines and self aligned contacts provides greater freedom in layout of circuit elements than was possible in the prior art. Irregular shaped protrusions of the active regions and of polysilicon regions are avoided because there is no need for large contact areas to make connection between the bit lines and active regions or between layers of polysilicon. The two pass transistors may be located on opposite sides of the memory cell and portions of the pass transistors may have novel shapes. The location and shapes of the active regions of the pass transistors permit the bit lines to be placed closer together while maintaining the necessary spacing between circuit elements. The cell thereby is smaller or alternatively larger spacing improves manufacturing yield.

In one embodiment of the invention, connections from the pass transistors to the bit lines are located on opposite sides of the cell and utilize self aligned contacts between the pass transistors and the bit lines. The memory cell includes two symmetric halves, each half including a pass transistor, a pull-down transistor, and a word line.

In another embodiment, interconnects which cross couple the gates and drains of pull-down transistors are connected to the transistor gates using self aligned contacts. The combination of self aligned contacts allows interconnects without large contact area.

In another embodiment of the invention a conducting region in the substrate connects the sources of the pull-down transistors to a reference potential. The conducting region is straight with parallel sides, and active regions of the pull down transistors are symmetrically positioned adjacent to opposite sides of the conductor. The layout of the conducting region and the pull-down transistors does not require protruding interconnects which waste semiconductor area.

DETAILED DESCRIPTION OF THE INVENTION

Figure 4:
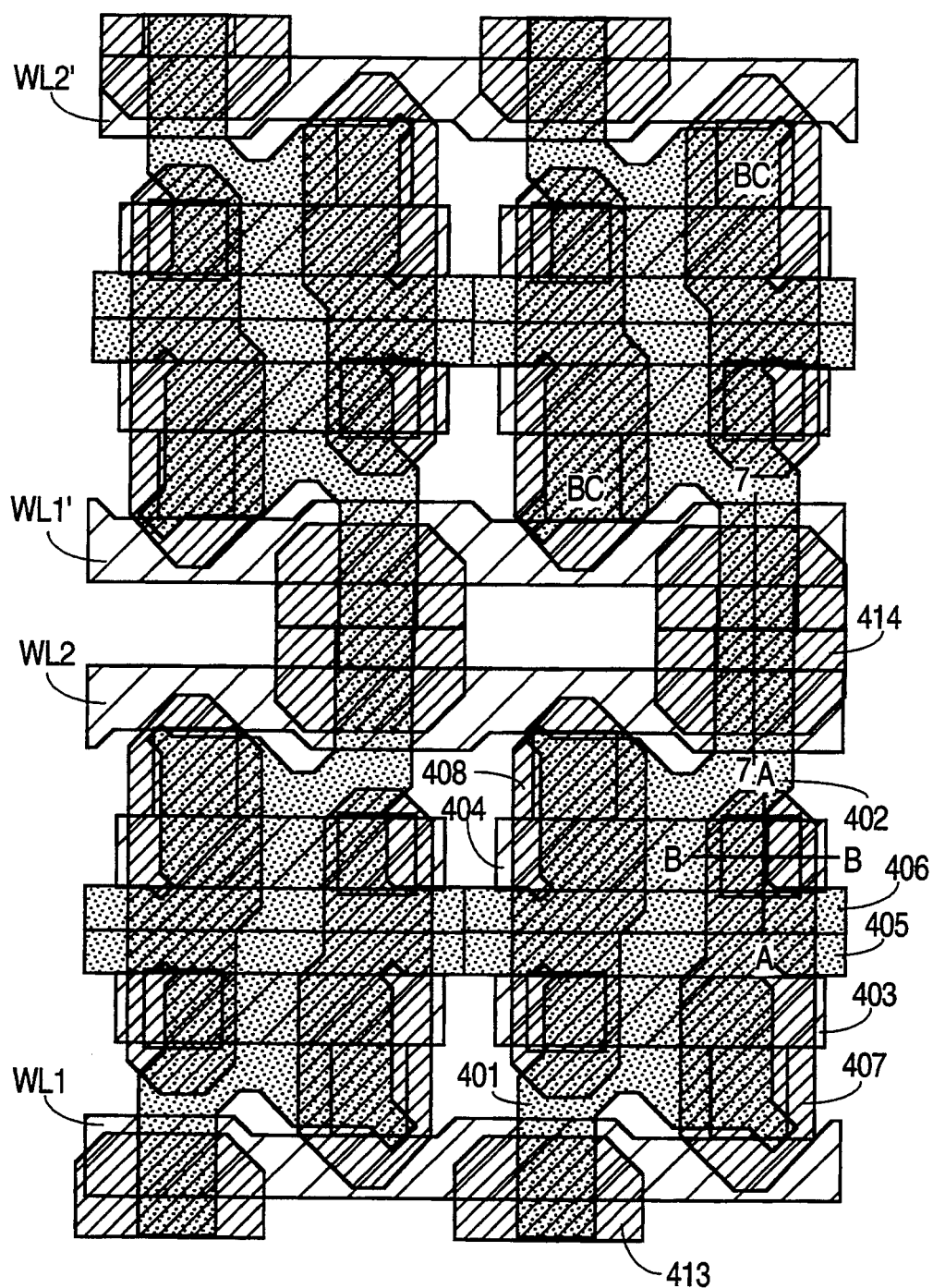
FIG. 4 shows a layout of active regions in a semiconductor substrate, a first layer, and a second layer which are part of four static random access memory cells in accordance with the present invention.

FIG. 4 shows a partial layout of elements in four static memory cells in accordance with the present invention. The partial layout includes active regions in a semiconductor substrate, a first layer, and second layer. In one embodiment, the semiconductor substrate is silicon, and the first and second layers are polysilicon. As is well known to those skilled in the art, other semiconductor materials, gallium-arsenide for example, and other layer materials can be used in the fabrication of integrated circuits. These other materials are in accordance with the present invention even though the remainder of this disclosure restricts itself to specific materials used in one embodiment.

In FIG. 4, the enclosed white areas represent regions of field oxide, while regions shaded as is region 401 are active N-type or P-type regions formed in a silicon wafer using well-known techniques. The areas shaded as is region 403 are formed from a first polysilicon layer (poly-1). The areas shaded as is region 407 are formed from a second polysilicon layer (poly-2). The polysilicon layers may be formed by low pressure chemical vapor deposition (LPCVD) or by other well-known methods. With the exception of contacts between layers described below, the layers shown are conventionally separated from each other by insulating layers not shown, formed using methods well known to those skilled in the art.

Active region 401 is part of both a first pull-down transistor and a first pass transistor for a memory cell shown in the lower right quadrant of FIG. 4. Poly-1 region 403 overlies the active region 401 and forms a gate for the first pull-down transistor. Active region 405 is electrically coupled to reference voltage $V_{SS}$ and coupled to the source of the pull-down transistor formed from the region 401. The word line WL1 overlies a portion of the active region 401 and forms a gate of the first pass transistor. The drain of the first pass transistor is connected to a poly-2 (doped polycrystalline silicon, second layer) region 413 by a self aligned contact. Region 413 serves as a "landing pad" for connection to bit lines as described below. Using self aligned contact techniques the region 413 can be large and can even overlap other circuit elements. The region 413 is a landing pad in the sense that it provides a convenient large area for bit lines connections.

Regions 402, 404, 406, 414 and word line WL2 are symmetric with regions 401, 403, 405, 413 and word line WL1, and form a second pull-down transistor and a second pass transistor in a similar manner to that described above.

Figure 7:
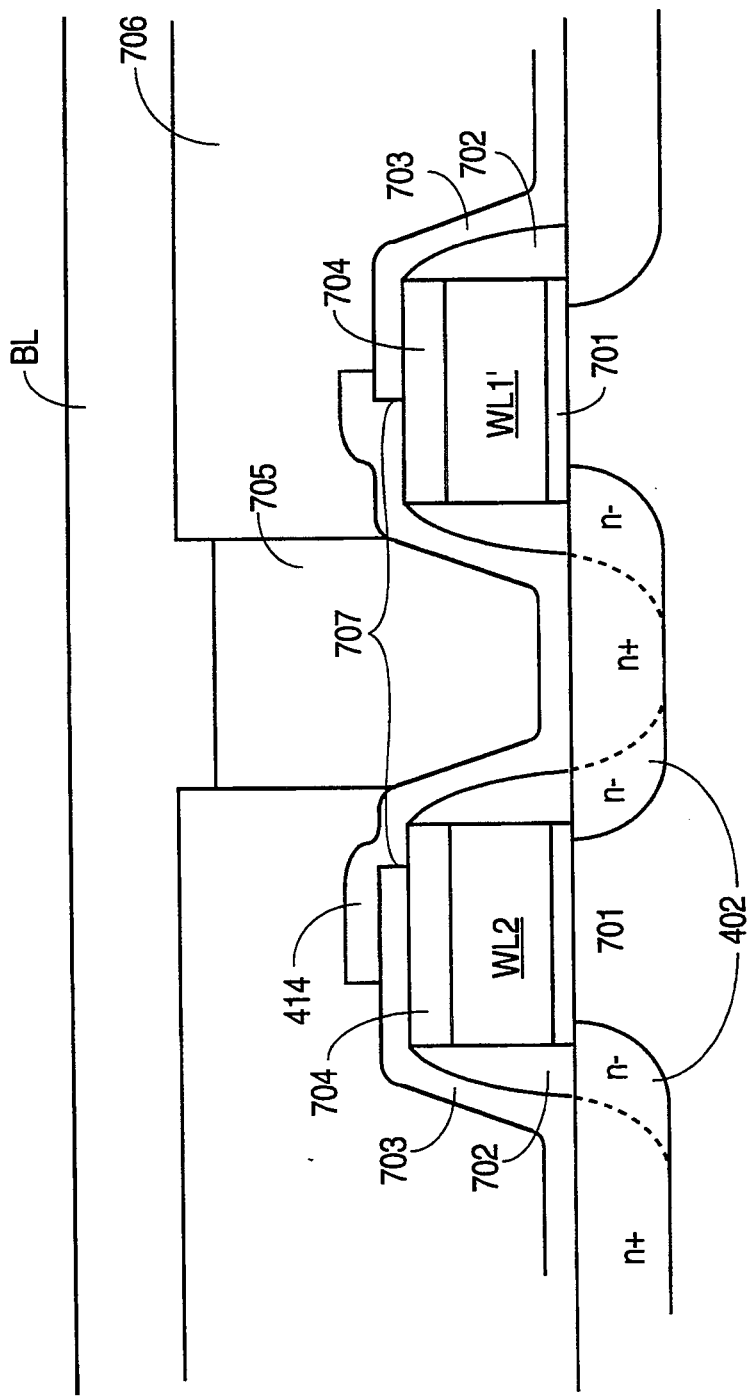
FIG. 7 shows a cross-sectional view through the axis 7—7 shown in FIG. 4 of a typical self aligned contact used as a bit line pick-up contact in the present invention.

Poly-2 region 407 electrically connects the gate region 404 of the second pull-down transistor to the drain of the first pass transistor formed from the active region 401. The connection between active region 401 and the poly-2 region 407 is made by a self aligned contact. The connection between poly-1 region 404 and the poly-2 region 407 is also made by a self aligned contact. The self aligned contacts may be formed using techniques described in application U.S. Pat. No. 5,166,771 which was incorporated above by reference. Further examples of a self aligned contacts are shown in FIGS. 7 and 8 herein and are discussed below.

Figure 1:
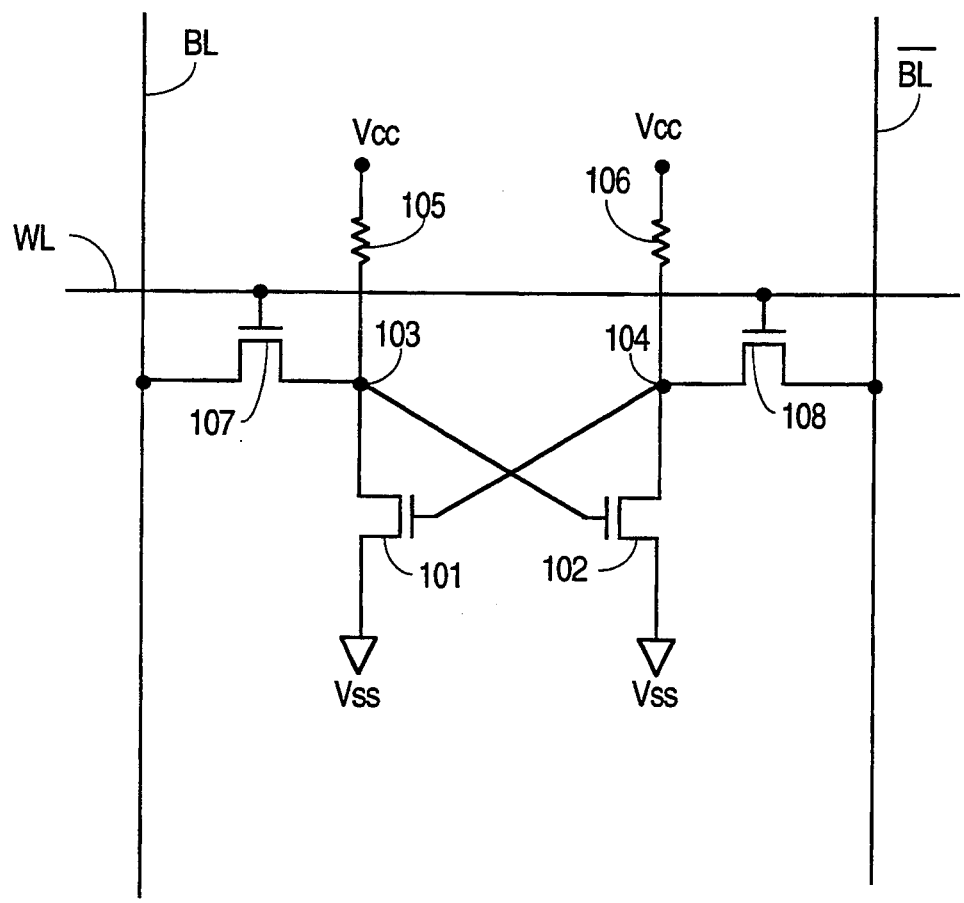
FIG. 1 shows a schematic of a prior art static memory cell.
Figure 2:
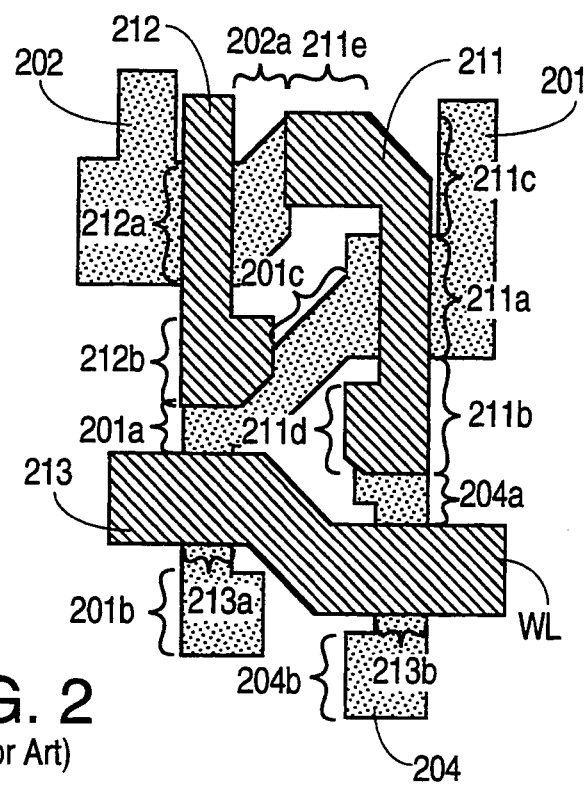
FIG. 2 shows a layout of active regions in a silicon substrate and a first polysilicon layer which are part of a prior art static random access memory cell.
Figure 3:
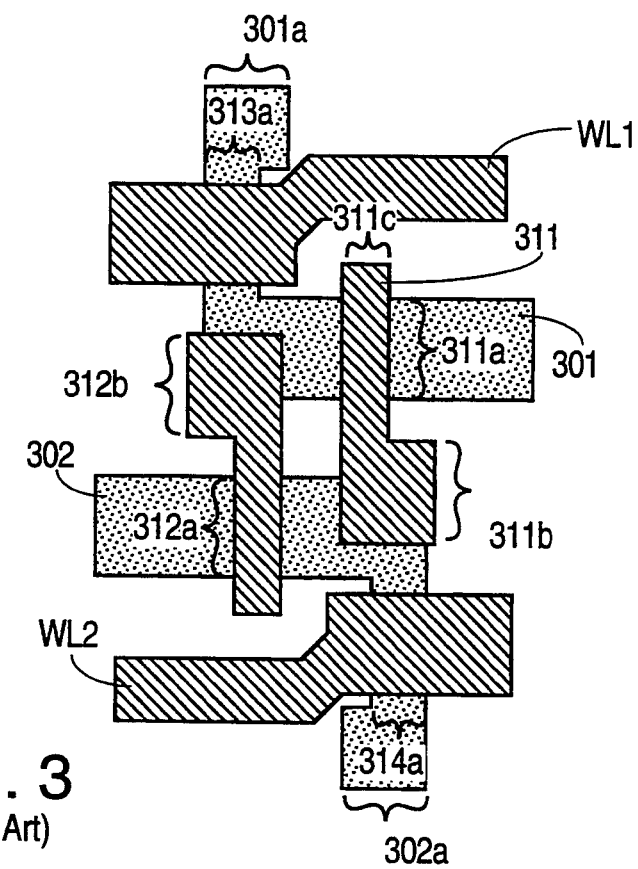
FIG. 3 shows a layout of active regions in a silicon substrate and a first polysilicon layer which are part of a prior art static random access memory cell which includes a split word line.

As shown in FIG. 4 the self aligned contacts do not require large area for alignment. This is in contrast to the prior art such as shown in FIG. 3 where contacts 311b, 312b make the shape of the active regions 311, 312 almost "L" shaped, because area where a contact may be formed must be large enough to accommodate the contact and expected misalignment. The smaller contacts in FIG. 4 permit the cell to be smaller, or alternatively improve yield by relaxing the critical dimensions of the cell.

Another advantage of the memory cell shown in FIG. 4 is the placement of the landing pads 413, 414 which connect to bit lines. Because the lines WL1 and WL2 are on opposite sides of the memory cell, the pass transistors and connections to the bit lines have wide vertical separation, so the bit lines may be placed closer together horizontally. This results in possible reduction in horizontal dimension of the memory cell. The horizontal separation is further decreased by the self aligned contacts.

Another advantage of the layout is its physical symmetry and therefore stability during read operations. As can be seen in FIG. 4, the active regions 401 and 402 have the same size and shape. The gates 403 and 404, the word lines WL1 and WL2, and the poly-2 interconnect regions 407 and 408 are also physically symmetric. The top half of the memory cell in FIG. 4 is symmetric with the bottom half upon a 180° rotation. This symmetry reduces any preference for a particular electrical state and makes the memory cell less prone to errors.

Still another advantage of the layout of FIG. 4 is the placement and shape of the conducting region 405, 406. Because the conducting region 405, 406 is parallel to the gate regions 403, 404 of the pull-down transistors, the conducting region 405, 406 may be straight and positioned adjacent to the active regions 401, 402 which form the pull-down transistors with the active regions, 401, 402 on opposite sides of the conducting region 405, 406. No protrusions from or extension of the conducting region are needed to connect to the active region of the pull-down transistor. This layout saves silicon area which would otherwise be required for protrusions and isolation regions surrounding the protrusions. Also by orienting the pull-down transistors so that the source is adjacent to the $V_{SS}$ conducting region 405, 406, less space is needed to isolate the $V_{SS}$ conducting region. Usable active area of the silicon substrate is thereby increased.

Figure 5:
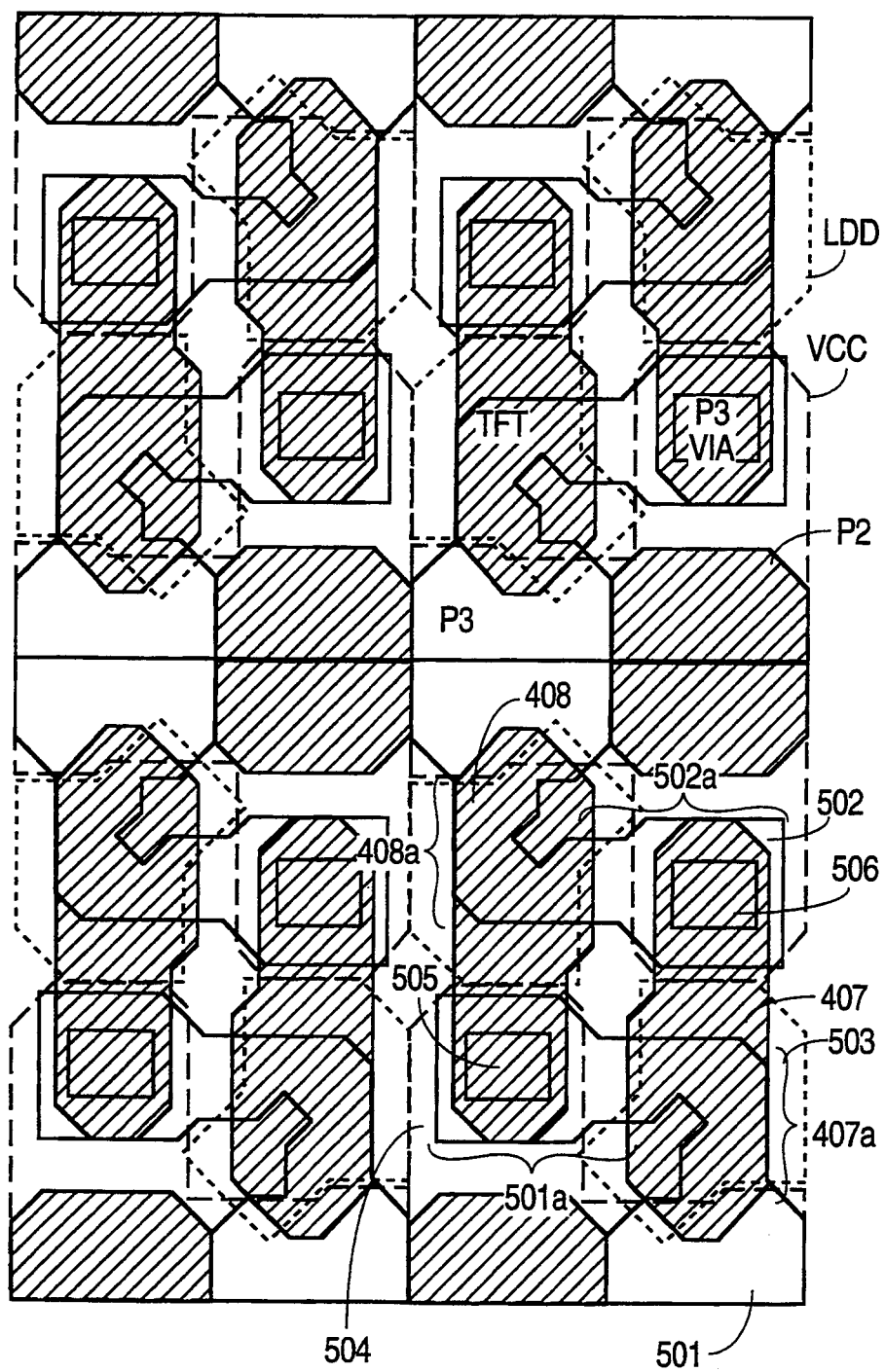
FIG. 5 shows a layout of the same four memory cells as in FIG. 4 but shows a third layer (semiconductor layer), and regions in the third layer that are subject to doping to form thin film transistors as pull-up devices for the memory cells.

FIG. 5 shows the poly-2 regions from FIG. 4 and shows an additional layer which may be added to form four memory cells. The poly-2 regions are shaded as is region 407. The regions outlined in a heavy solid line are a third doped polycrystalline silicon layer (poly-3). The regions outlined in small dots such as region 503, are mask regions which are protected from a subsequent light B or $BF_2$ implant of the remainder of the poly-3, and the regions outlined in dots and dashes such as region 504, are regions subjected to a heavy implant of B or $BF_2$ to form P+ regions in the poly-3 layer. The implants of B or $BF_2$ may be preformed using well known techniques.

Poly-3 regions 501 and 502 form a first and a second thin film transistor (TFT) which can be used as pull-up devices. The poly-2 interconnect region 407 forms a gate 407a for the first TFT, while the poly-2 interconnect region 408 forms a gate 408a for the second TFT. The gate 407a of the first TFT is thereby coupled to the drain of the first pull-down transistor and to the gate of the second pull-down transistor. The drain 501a of the first TFT is connected to the poly-2 interconnect 408 by way of self aligned contact 505. The drain 502a of the second TFT is connected to the poly-2 region 407 by self aligned contact 506. Thus, the gates and drains of the TFTs are cross-coupled.

Figure 6:
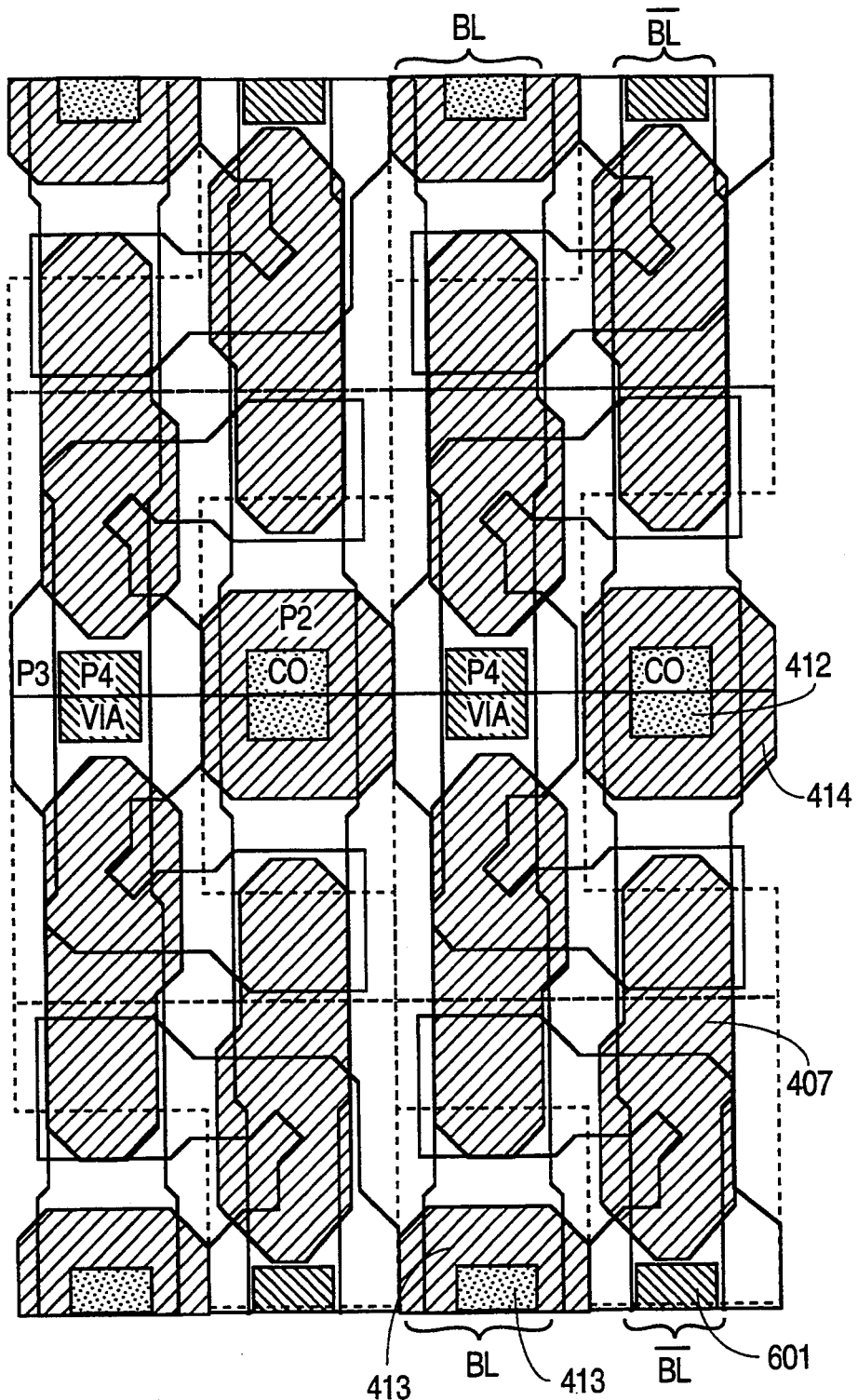
FIG. 6 shows a layout of the same four memory cells as shown in FIGS. 4 and 5 but shows a fourth layer, and a fifth layer that can be added to form connections to $V_{CC}$ and to form bit lines.

FIG. 6 shows additional layers which can be added to the layouts of FIGS. 4 and 5. As in FIGS. 4 and 5 the regions shaded the same as region 407 are poly-2. As in FIG. 5, the regions enclosed in heavy solid lines are poly-3. The heavy dotted line enclosed regions of a fourth doped polycrystalline silicon layer (poly-4). The medium solid line enclose metal bit lines that are formed above the poly-4 region.

The poly-4 layer covers most of the cell area except for contacts between the bit lines and the landing pads such as 413, 414. The poly-4 regions are connected to a voltage supply $V_{CC}$ and provide power to the TFT pull-up transistors by way of vias such as 601 that connect the poly-3 sources of the TFT pull-up transistors to poly-4 $V_{CC}$. It should be noted that the layers shown in FIGS. 5 and 6 maintain the symmetry of FIG. 4.

Bit lines BL and $\overline{BL}$ connect to the drains of the pass transistors by way of landing pads such as 413, 414 and contacts such as 411, 412. FIG. 7 shows a cross-sectional view of a self aligned contact between the bit line BL and the active region 401.

Figure 8A:
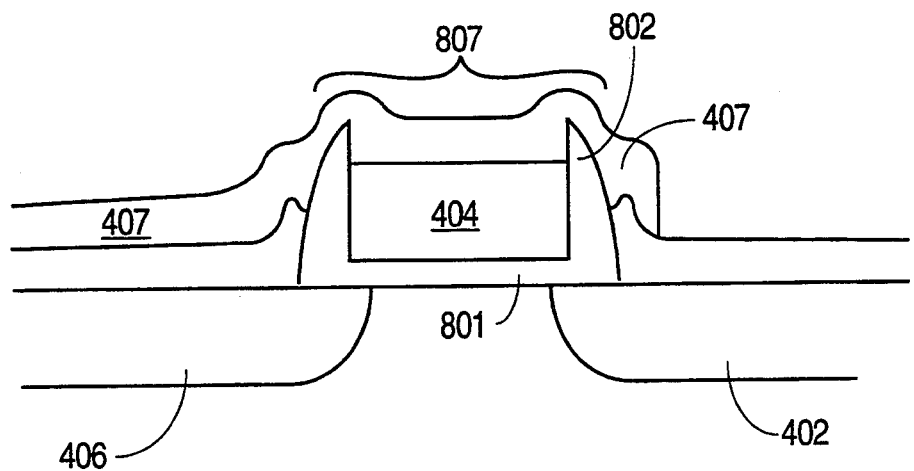
FIGS. 8A and 8B show cross-sectional views along two perpendicular axes A—A and B—B shown in FIG. 4 of a self aligned contact between a first polysilicon layer which forms gates of the pull-down transistor and a second polysilicon layer which forms a cross-couple conductor.
Figure 8B:
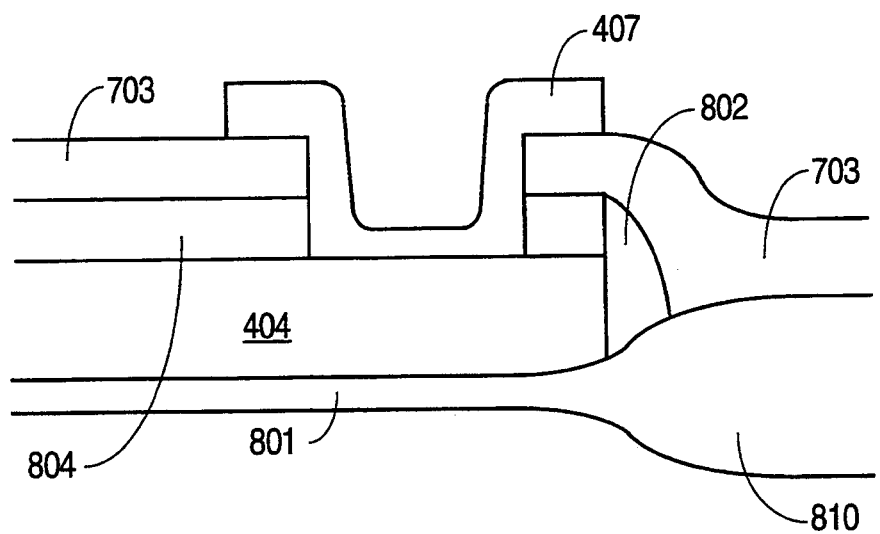

FIG. 7 shows how the bit line BL connects to the pass transistor formed from the active region 401 using a self aligned contact. FIGS. 8A and 8B show how interconnects, such as poly-2 regions 407, connect to underlying gates, such as poly-1 regions 404, using a second type of self aligned contact. The fabrication of both types of self aligned contacts is described below beginning with the steps that are common to both types of contact.

First field-oxide 810 and active regions are defined using well known methods, then a thin oxide layer 701, 801 is thermally grown on the silicon surface. A first polysilicon layer is then deposited and doped to achieve the desired conductivity. An insulating layer of silicon nitride is deposited on top of the first polysilicon layer. Insulating regions 704, 804 are remnants of the silicon nitride layer.

Word lines WL1' and WL2 in FIG. 7 and the pull-down gate 404 in FIG. 8 are then formed from the stack of the gate-oxide, the first polysilicon layer, and the silicon nitride layer, using etching techniques known to those skilled in the art.

Next, oxide spacers 702, 802 are formed on the sides of the exposed poly-1 regions and active regions 402, 406 are formed employing ion implantation or other common semiconductor manufacturing techniques. Then, overall deposition of an oxide layer is performed.

The steps to form the two types of self aligned contact differ at this point. For the contacts between the bit lines and the underlying active layer shown in FIG. 7, an etching of the oxide layer 703 to form contact cavities such as 707 is performed using a timed etch. The timed etch is halted after the contact cavities to the active regions are opened but before the silicon nitride layer 704 or the thick oxide spacers 702 is removed. In this way the underlying active region 402 is exposed while the poly-1 regions WL1', WL2 remain insulated. The etching of the contact hole 707 need not avoid the poly-1 regions WL2, WL1' because the silicon nitride layer 704 and the oxide spacers 702 provide a margin that allows the contact cavities to be etched right over the top of the poly-1 region.

To manufacture the contacts in FIG. 8, a layer of photo-resist is deposited, planarized, and etched back to expose the raised areas of oxide while protecting the oxide on top of the active areas. This method is described in more detail in application U.S. Pat. No. 5,166,771. Masking and etching of the oxide layer 703 removes portions of the oxide layer that are not covered by the planarized photo-resist and the mask. This is followed by etching of the silicon nitride layer to expose the underlying first polysilicon layer 404, while the active regions 402 remain insulated. The etched contact hole can be larger than the underlying contact region because the photoresist protects all region except the built up poly-1 regions.

The etching and resulting contact are self aligned in the sense that tolerance need not be included in the layout of the memory cell. The selective etching automatically avoids exposing the poly-1 regions WL1', WL2 in FIG. 7 and the active regions 406, 402 in FIG. 8. A second polysilicon layer can then be formed, masked, and etched to make the landing pad 414 and the interconnect 407. The landing pad 414 is electrically connected to the active region 401 but isolated from the poly-1 layer. The interconnect 407 is electrically connected to the poly-1 gate 404 and is isolated from the active regions 402, 406.

An insulating layer 706 is then formed, followed by an etching and a deposition of a conducting plug 705 which connects the bit line BL to the landing pad 414.

The explanations of two types of self aligned contact are examples. Many other techniques for forming self aligned contacts besides those discussed above are possible. Those skilled in the art will appreciate that other methods of forming self aligned contacts can be used in embodiments of the present invention.

The structure which defines a self aligned contact is characterized by the relation between the size of the contact hole and the area set aside for connections. For contacts that are not self aligned, the contact area and surrounding isolation region must be larger than an etched contact hole by an amount greater than the expected possible misalignment. In FIG. 3, the large size of the contact region 311b for a contact area the width of the gate 311a shows the contact is not self aligned. FIGS. 7 and 8A show self aligned contacts where the width of the contact hole 707, 807 are even larger than the regions being connected 402, 404.

Although the present invention has been described in detail, the description is only an illustration or example of the invention's application and should not be taken as a limitation. Other embodiments fit within the spirit of the present invention. For example, resistors rather than transistors could be used as pull-up devices, and the composition of the substrate and the various described layers could be replaced by other materials appropriate to integrated circuit fabrication. The scope of the present invention is limited only by the claims.

I claim:

1. In an integrated circuit formed in and on a semiconductor substrate, a portion of a memory cell comprising:

a first and a second pass transistor having active regions formed in the semiconductor substrate, each pass transistor having a gate electrode;

a split word line comprising a first and a second word line formed above the semiconductor substrate, wherein the first word line is connected to the gate electrode of the first pass transistor and the second word line is connected to the gate electrode of the second pass transistor;

a first and a second pull-down transistor having active regions formed in the semiconductor substrate, the first pull-down transistor having a gate electrode formed above the semiconductor substrate, the first pull-down transistor being electrically connected to the first pass transistor, the second pull-down transistor being electrically connected to the second pass transistor; and a contact structure comprising:

an insulating layer located above the semiconductor substrate and above the gate electrode of the first pull-down transistor, the insulating layer having a cavity at least partly overlying the active region of the first transistor, the cavity having a width greater or equal to a length of the gate electrode of the first pull-down transistor; and a contact layer, a part of the contact layer being located in the cavity, a portion of the part of the contact layer in the cavity being in electrical contact with the gate electrode of the first pull-down transistor.

2. In an integrated circuit, a memory cell comprising:

a split word line including a first and a second word line which are electrically connected together outside the memory cell;

a first and a second pass transistor, each pass transistor having a gate, a source, and a drain, the first word line being electrically connected to the gate of the first pass transistor, the second word line being electrically connected to the gate of the second pass transistor;

a first and a second pull-down transistor, each pull-down transistor having a gate and an active region that forms a source and a drain, the drain of the first pull-down transistor being electrically connected to the source of the first pass transistor, the drain of the second pull-down transistor being electrically connected to the source of the second pass transistor;

an insulating layer overlying the gate of the first pull-down transistor; and a conducting region which is electrically connected to the gate of the first pull-down transistor and to the drain of the second pull-down transistor, the conducting region electrically connecting to the gate of the first pull-down transistor by way of an opening which is through the insulating layer and at least partly overlying the active region of the first pull down transistor.

3. The memory cell of claim 2 wherein the memory cell is symmetric under a 180° rotation about the center of the cell.

4. The memory cell of claim 2 further comprising a bit line, wherein:

the drain of the first pass transistor and the drain of the second pass transistor are located on opposite sides of the memory cell;

the insulating layer overlies the gate and the drain of the second pass transistor; and the drain of the first pass transistor is connected to the bit line by way of an opening which is through the insulating layer and partly overlying the gate of the second pass transistor.

5. The memory cell of claim 2, wherein:

the insulating layer overlies the gate of the second pull down transistor; and the conducting region connects to the drain of the second pull-down transistor by way of an opening which is through the insulating layer and partly overlying the gate of the second pull-down transistor.

6. The memory cell of claim 5 further comprising a pull-up transistor.

7. The memory cell of claim 6 wherein the pull-up transistor is a thin film transistor formed overlying the pull-down transistors, wherein the interconnect forms a gate for the pull-up transistor.

8. A portion of a static random access memory cell comprising:

a semiconductor substrate;

a first word line and a second word line;

a first transistor having a current handling electrode D1, another current handling electrode S1, and a gate G1, the first transistor comprising a first active region formed between the first word line and the second word line;

a second transistor having a current handling electrode D2, another current handling electrode S2, and a gate G2, the second transistor comprising a second active region formed between the first word line and the second word line;

an insulating layer overlying the electrodes D1 and D2 and the gates G1 and G2;

a first interconnect electrically connecting the electrode D1 to the gate G2, the first interconnect being connected to the electrode D1 by way of an opening though the insulating layer and partly overlying the gate G1, the first interconnect being connected to the electrode G2 by way of an opening though the insulating layer and partly overlying the electrode D2; and a second interconnect electrically connecting the electrode D2 to the gate G1, the second interconnect being connected to the electrode D2 by way of an opening though the insulating layer and partly overlying the gate G2, the second interconnect being connected to the electrode G1 by way of an opening though the insulating layer and partly overlying the electrode D1.

9. A portion of a static random access memory cell comprising:

a semiconductor substrate;

a conducting region formed in the semiconductor substrate for connecting to a reference voltage $V_{SS}$, the conducting region having a first side and a second side opposite the first;

a first word line and a second word line located on opposite sides of the conducting region;

a first transistor having a current handling electrode D1, another current handling electrode S1, and a gate G1, the first transistor comprising a first active region formed adjacent to the first side of the conducting region between the conducting region and the first word line; and a second transistor having a current handling electrode D2, another current handling electrode S2, and a gate G2, the second transistor comprising a second active region formed adjacent to the second side of the conducting region between the conducting region and the second word line, wherein the conducting region is straight and the first and the second sides of the conducting region are parallel to each other, and wherein the first and second word lines are parallel to the conducting region and each other.

10. The portion of a memory cell of claim 9 wherein:

the gate G1 is rectangular with its longer sides parallel to the conducting region; and the gate G2 is rectangular with its longer sides parallel to the conducting region.

11. The portion of a memory cell of claim 10 further comprising:

an insulating layer overlying the electrodes D1 and D2 and the gates G1 and G2, a first interconnect electrically connecting the electrode D1 to the gate G2, the first interconnect being connected to the electrode D1 by way of an opening though the insulating layer and partly overlying the gate G1, the first interconnect being connected to the electrode G2 by way of an opening though the insulating layer and partly overlying the electrode D2; and a second interconnect electrically connecting the electrode D2 to the gate G1, the second interconnect being connected to the electrode D2 by way of an opening though the insulating layer and partly overlying the gate G2, the second interconnect being connected to the electrode G1 by way of an opening though the insulating layer and partly overlying the electrode D1.

* * * * *